(12) United States Patent
Nakata

(10) Patent No.: US 8,049,796 B2
(45) Date of Patent: Nov. 1, 2011

(54) METHOD OF CORRECTING SENSITIVITY AND IMAGING APPARATUS

(75) Inventor: Takatoshi Nakata, Setagaya-ku (JP)

(73) Assignee: Kyocera Corporation, Kyoto (JP)

( * ) Notice: Subject to any disclaimer, the term of this patent is extended or adjusted under 35 U.S.C. 154(b) by 438 days.

(21) Appl. No.: 12/438,715

(22) PCT Filed: Aug. 24, 2007

(86) PCT No.: PCT/JP2007/066492
§ 371 (c)(1),
(2), (4) Date: Feb. 24, 2009

(87) PCT Pub. No.: WO2008/023806
PCT Pub. Date: Feb. 28, 2008

(65) Prior Publication Data
US 2010/0253812 A1    Oct. 7, 2010

(30) Foreign Application Priority Data

Aug. 25, 2006    (JP) ................................. 2006-229229

(51) Int. Cl.
*H04N 9/64*    (2006.01)
*H04N 5/225*    (2006.01)
(52) U.S. Cl. ..................................... 348/251; 348/218.1
(58) Field of Classification Search ............... 348/218.1, 348/241, 251, 294, 297, 308
See application file for complete search history.

(56) References Cited

U.S. PATENT DOCUMENTS

| | | | |
|---|---|---|---|
| 6,879,730 B1 | 4/2005 | Hirakawa | 382/274 |
| 6,930,722 B1 | 8/2005 | Nakamura et al. | |
| 7,349,015 B2 | 3/2008 | Harada et al. | |
| 2004/0239781 A1 | 12/2004 | Harada et al. | |
| 2005/0219404 A1 | 10/2005 | Koyayashi | 348/362 |
| 2005/0231619 A1 | 10/2005 | Nakamura et al. | 348/303 |

(Continued)

FOREIGN PATENT DOCUMENTS

EP    2061235 A1 *    5/2009

(Continued)

OTHER PUBLICATIONS

English translation of International Search Report (PCT/ISA/210) for prepared for PCT/JP2007/066492 on Sep. 17, 2008.*

(Continued)

*Primary Examiner* — David N Spector
(74) *Attorney, Agent, or Firm* — DLA Piper LLP (US)

(57) ABSTRACT

An object of the invention is to provide a method of correcting sensitivity and an imaging apparatus, by which shading correction can be performed with good accuracy even with a simple structure. A method of correcting sensitivity includes providing imaging elements each including a photosensitive section (15) which performs photoelectric conversion of incident light, an electric charge accumulation section (18) which accepts transfer of electric charge accumulated in the photosensitive section (15) and temporarily accumulates the electric charge, and an electric charge correction section (20) which estimates electric charge intruding into the electric charge accumulation section (18); receiving light from an object by the imaging elements (3) to accumulate electric charge; thereafter transferring electric charge accumulated in the photosensitive section (15) to the electric charge accumulation section (18); correcting a first amount of electric charge ($p_1$) accumulated therein with a second amount of electric charge ($p_2$) having intruded into the electric charge correction section (20) to produce a third amount of electric charge ($p_3$); and sequentially outputting third amounts of electric charge ($p_3$) as amounts of electric charge of the respective imaging elements (3), thereby removing shading.

9 Claims, 10 Drawing Sheets

U.S. PATENT DOCUMENTS

2006/0158539 A1     7/2006     Koizumi et al. ............. 348/300

FOREIGN PATENT DOCUMENTS

| JP | 08-205034 | 8/1996 |
|---|---|---|
| JP | 10-097617 | 4/1998 |
| JP | 11-069154 | 3/1999 |
| JP | 2000-023044 | 1/2000 |
| JP | 2000-358142 | 12/2000 |
| JP | 2003143489 A | 5/2003 |
| JP | 2004056048 A | 2/2004 |
| JP | 2005051282 A | 2/2005 |
| JP | 2005-080062 | 3/2005 |
| JP | 2005-175682 | 6/2005 |
| JP | 2005-269339 | 9/2005 |
| JP | 2005-328420 | 11/2005 |
| JP | 2006-197383 | 7/2006 |
| JP | 2006-217410 | 8/2006 |
| JP | 2006-217548 | 8/2006 |
| JP | 2006217548 A | 8/2006 |

OTHER PUBLICATIONS

English translation of Written Opinion of the International Search Authority (PCT/ISA/237) for prepared for PCT/JP2007/066492 on Feb. 25, 2009.*

Chinese language office action dated Jul. 5, 2010 and its English language translation for corresponding Chinese application 200780031679.9.

Extended European search report dated Apr. 4, 2011 for corresponding European application 07806078.7.

* cited by examiner

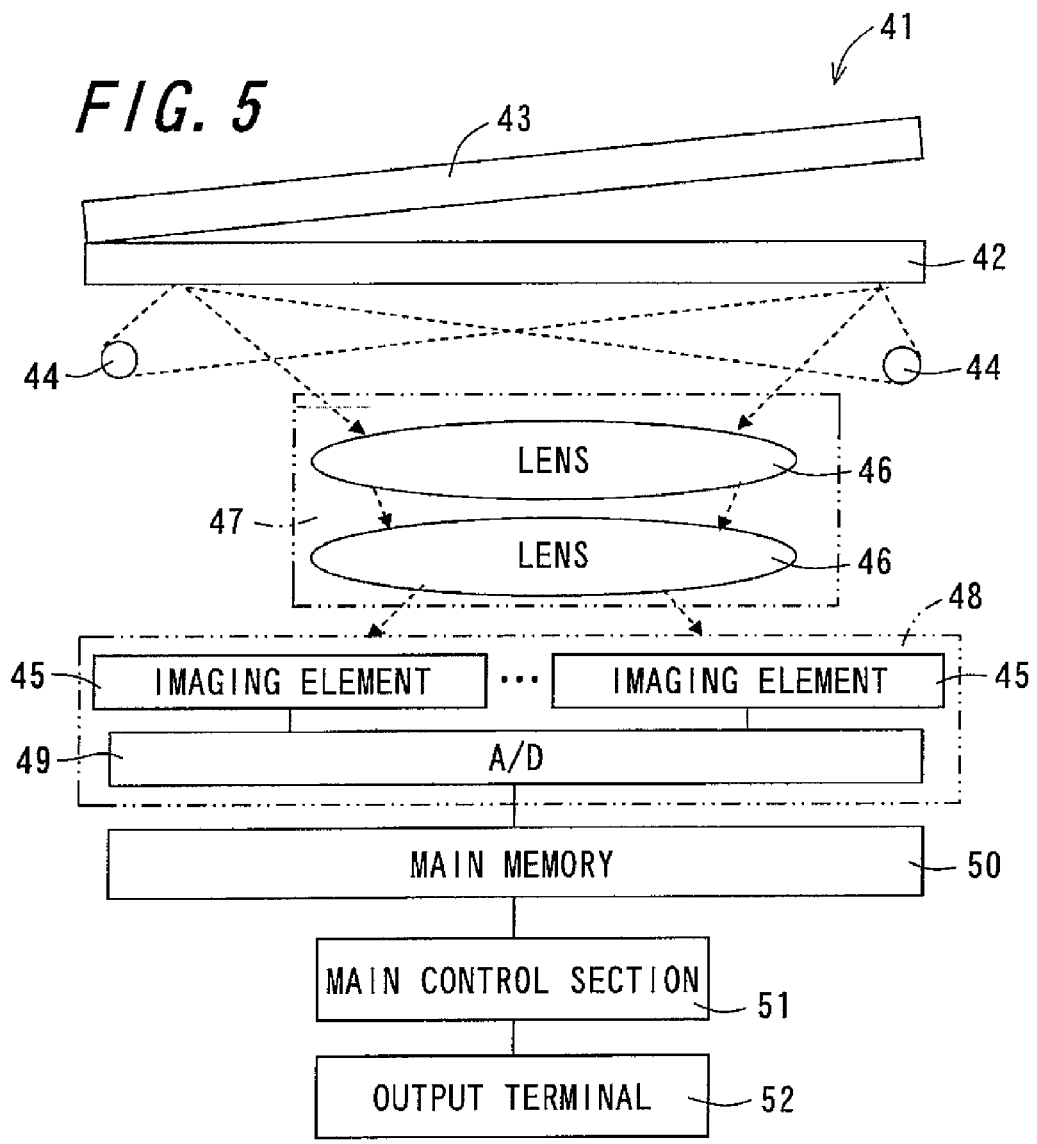

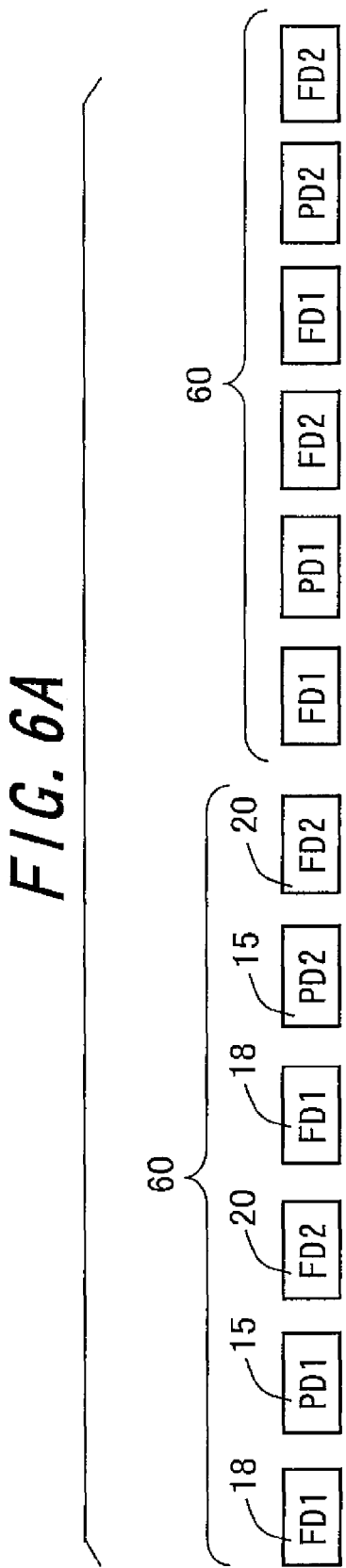

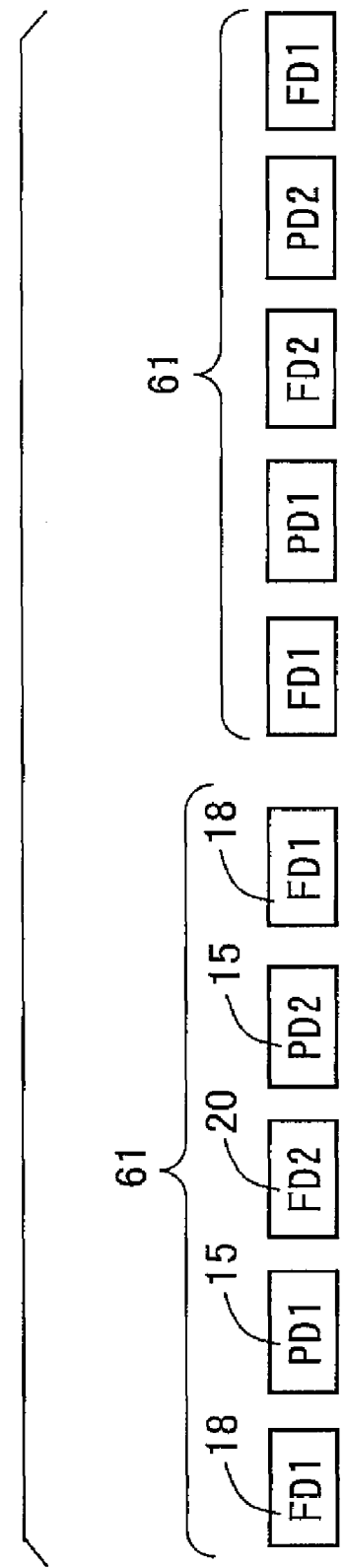

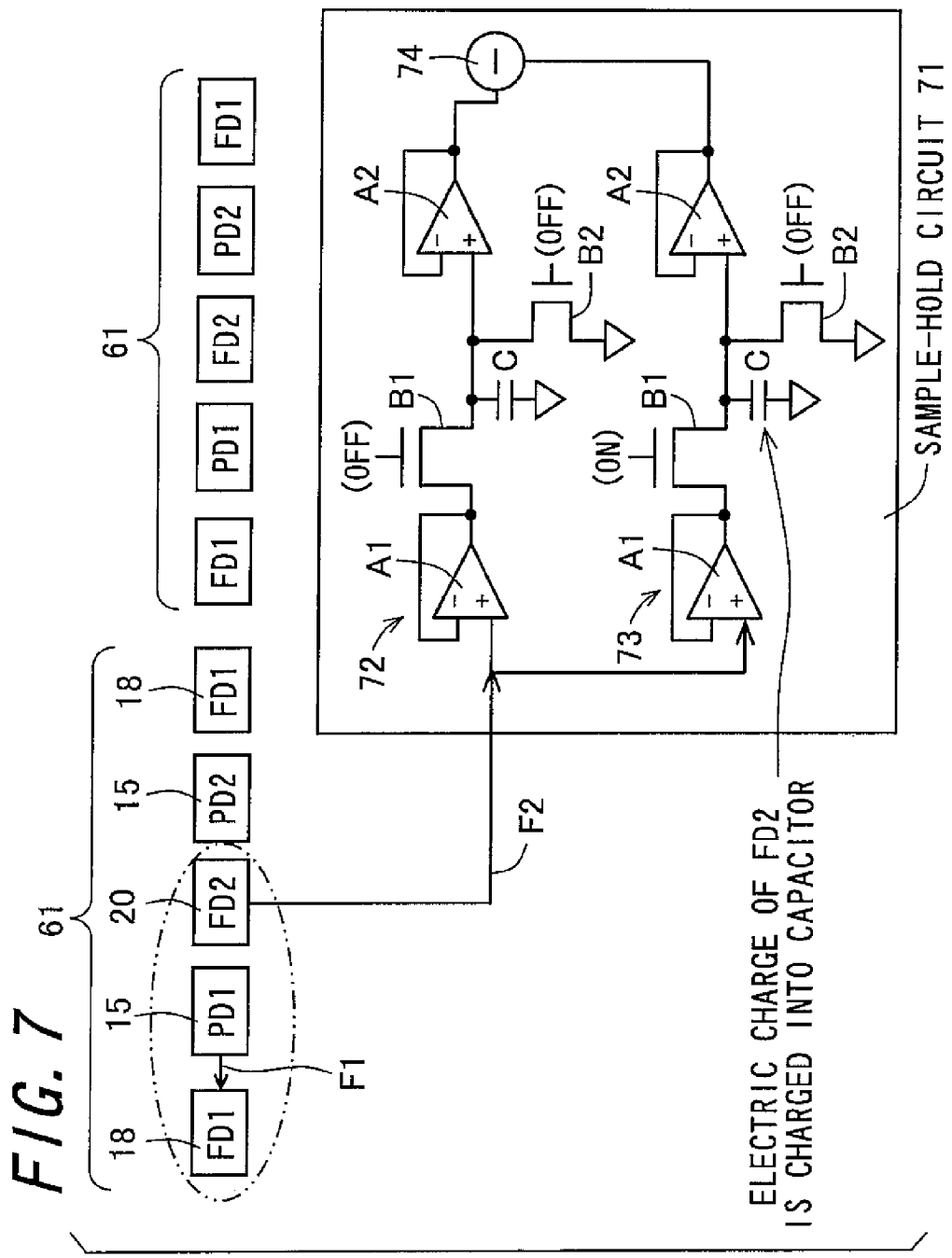

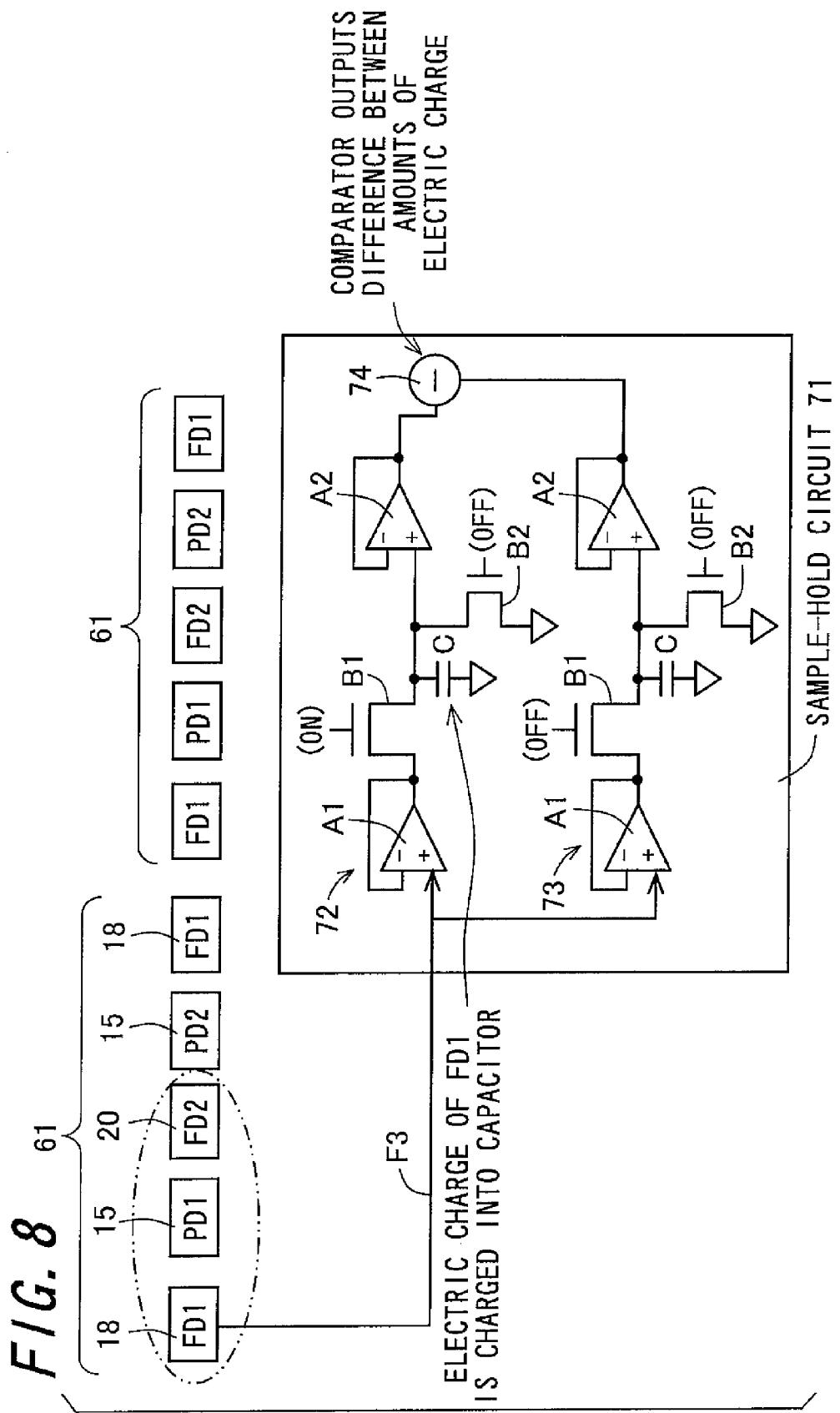

METHOD OF CORRECTING SENSITIVITY AND IMAGING APPARATUS

CROSS-REFERENCE TO THE RELATED APPLICATIONS

This application is a national stage of international application No. PCT/JP2007/066492 filed Aug. 24, 2007, which also claims the benefit of priority under 35 UCS 119 to Japanese Patent Application No. 2006-229229 filed Aug. 25, 2006, the entire contents of which are incorporated herein by reference.

TECHNICAL FIELD

The present invention relates to a method of correcting sensitivity and an imaging apparatus, particularly to a method of correcting sensitivity and an imaging apparatus, in which when signals of light from an object are received by a plurality of imaging elements simultaneously to capture an image of the object, the influence of shading on the captured image is removed therefrom.

BACKGROUND ART

In recent years, imaging apparatuses having a plurality of imaging elements for taking an image of an object and an image-taking optical system for focusing light from the object on image-taking means have been developed widely for uses of e.g. X-ray CT apparatuses, duplicators, facsimile machines, scanners and camera modules including digital cameras, surveillance cameras and on-vehicle cameras.

In such imaging apparatuses, imaging elements are used to detect the intensity of light from an object, whereby an image is captured. However, it has been known that the amount of received light of respective imaging elements disagrees with actual signals owing to the drop in amount of light around a lens and the variations in sensitivities of imaging elements, causing an image nonuniformity in an image output. Hence, to eliminate such image nonuniformity, shading correction is performed.

For example, Japanese Unexamined Patent Publication JP-A 10-97617 (1998) discloses a method of performing data correction at the time of taking an image of an object based on shading correction data which have been prepared in advance based on white-reference-image-taking signals gained by taking an image of a white reference plate and black-reference-image-taking signals obtained by taking an image of a black reference plate. In addition, Japanese Unexamined Patent Publication JP-A 11-69154 (1999) discloses a correcting method of performing shading correction by use of histogram peak frequency values resulting from histogram peak frequency calculation performed for each of the imaging elements.

Further, Japanese Unexamined Patent Publication JP-A 2000-358142 discloses a correcting method which uses data gained from light coming out of a light source through a correcting member as shading data in parallel with irradiating an object with light from a light source. In addition, Japanese Unexamined Patent Publication JP-A 2005-80062 discloses a digital camera which performs shading correction by multiplying a shading correction factor in a first direction by a shading correction factor in a second direction perpendicular to the first direction.

It is disclosed in Japanese Unexamined Patent Publication JP-A 2005-269339 that first and second photosensitive sections differing in sensitivity are provided to perform color shading correction (correction of chromatic aberration) on each of imaging elements based on the difference in the amounts of light received by the two photosensitive sections, whereby color shading correction on each of pixels (imaging element) having a wide dynamic range can be conducted with a small memory capacity for a short time.

However, the correcting methods as disclosed by JP-A 10-97617, JP-A 11-69154, JP-A 2000-358142 and JP-A 2005-80062, by which shading data are prepared separately to conduct shading correction, have a problem that shading correction cannot be performed completely by a capturing way that light signals received by the imaging elements are read in one by one after the imaging elements have received signals from an object in parallel.

Specifically, causes of image nonuniformity include the fluctuation in amount of electric charge at the time of capturing signals into the imaging elements in addition to the drop in amount of light around a lens and the variation in sensitivity of imaging elements. For example, a method that images corresponding to one screen are captured in simultaneously like a global shutter technique using a CMOS sensor (Complementary Metal Oxide semiconductor sensor) is one which includes starting accumulation of electric charge accumulation for a plurality of imaging elements with the same timing, thereafter terminating the accumulation of electric charge with the same timing, and concurrently with the termination, taking out the electric charges accumulated in the imaging elements, which has an advantage that no image is distorted even when a target is moving rapidly because exposure is performed for all the taken images simultaneously. In such method, the time between termination of accumulation of electric charge and takeout thereof varies according to the respective imaging elements. On the other hand, the amount of electric charge accumulated in the imaging elements is increased owing to intrusion of electric charge brought about by various causes. However, it is known that the increase in the amount of electric charge varies depending on the amount of received light and the accumulation time. Hence, there is a problem that the image nonuniformity takes place because the amount of electric charge accumulated in the imaging elements increases before takeout thereof, and the amount of increased electric charge differs according to the imaging elements.

This is a result of the fact that the amount of electric charge accumulated in a portion lower a photosensitive section, such as a photodiode constituting an imaging element, intrudes into an electric charge accumulation section included in the imaging element before takeout of the amount of electric charge accumulated in the imaging element. Further, the amount of electric charge so intruding varies depending on the amount of electric charge accumulated in the imaging element. Therefore, image nonuniformity has been unable to be compensated completely by a conventional method such that shading data are prepared separately.

The fluctuation in the amount of electric charge to be corrected according to the amount of electric charge accumulated in the imaging element has been a phenomenon which takes place not only in the case of the global shutter technique using a CMOS sensor but also commonly in an imaging apparatus that images corresponding to one screen are captured into a plurality of imaging elements in parallel. Further, in any cases, an accurate shading correction method has been required.

In addition, according to the method including determining a difference between the amounts of light received by two photosensitive sections, and performing color shading correction on each of pixels based on the difference therebetween, as in JP-A 2005-269339 (2005), color shading correction on each of pixels can be performed, however, it has been impossible to compensate image nonuniformity resulting from the influence of leak of electric charge accumulated in each of imaging elements.

DISCLOSURE OF THE INVENTION

The invention has been made to eliminate the problems, and its object is to provide a method of correcting sensitivity and an imaging apparatus, by which shading correction can be performed with good accuracy even with a simple structure.

The invention provides a method of correcting sensitivity for removing shading arising at the time of capturing an image of an object by receiving light from the object by a plurality of imaging elements, the imaging elements each comprising a photosensitive section which receives incident light to perform photoelectric conversion, an electric charge accumulation section which accepts transfer of electric charge accumulated in the photosensitive section owing to the incident light and which temporarily accumulates the electric charge, and an electric charge correction section which estimates electric charge intruding into the electric charge accumulation section, the method comprising receiving light from the object by the plurality of imaging elements to accumulate electric charge; thereafter transferring electric charge accumulated in the photosensitive section to the electric charge accumulation section; correcting a first amount of electric charge accumulated in the electric charge accumulation section with a second amount of electric charge having intruded into the electric charge correction section to produce a third amount of electric charge; and outputting the third amount of electric charge as the amount of electric charge of each of the imaging elements.

Now, in the invention, it is desired that after the light from the object are received by the plurality of imaging elements and at the same time the electric charge is accumulated, the amounts of electric charge of the plurality of imaging elements are sequentially outputted.

According to the method of correcting sensitivity of the invention, the electric charge correction section directly estimates and corrects, for respective electric charge accumulation sections, the amount of electric charge intruding, with time, into the electric charge accumulation section which accepts transfer of electric charge accumulated in the photosensitive section owing to incident light, and temporality accumulates the electric charge, whereby the influence of intruding electric charge on each of imaging elements can be corrected. Particularly, in case that the time between accumulation of electric charge in the electric charge accumulation section and output therefrom varies among the imaging elements depending on a data output method which includes accumulating electric charge in imaging elements at the same time and then sequentially outputting the amounts of electric charge of the imaging elements, if a first amount of electric charge accumulated in the electric charge accumulation section is different among the imaging elements owing to the amount of electric charge intruding into the electric charge accumulation section with time, shading correction can be performed with good accuracy even with a simple structure by: correcting the first amount of electric charge with a second amount of electric charge having intruded into the electric charge correction section into a third amount of electric charge, from which the influence of the electric charge having intruded into the electric charge accumulation section owing to the change with time is removed; and outputting the third amount of electric charge as the amount of electric charge of each of imaging elements.

Herein, it is desired that the electric charge accumulation section and electric charge correction section are constructed of identical members disposed at locations separated from the photosensitive section by the same distance; and the electric charge accumulation section and electric charge correction section are floating diffusion amplifiers.

Constructing the electric charge accumulation section and electric charge correction section of identical members disposed at locations separated from the photosensitive section by the same distance makes adjustment of layout of the members easier and an operation simpler.

Further, it is desired that areas of parts of the light-receiving face of each of imaging elements occupied by the electric charge accumulation section and electric charge correction section are not more than one-tenth of the area of a part thereof occupied by the photosensitive section, respectively.

Further, it is desired that the electric charge accumulation section and electric charge correction section are floating diffusion amplifiers in: a shutter can be opened and closed; it becomes easier to adjust the timing of accumulating electric charge; and a more brilliant image can be formed by increasing the number of pixels because of their smaller size in comparison to that of a member making the photosensitive section, e.g. a photodiode. Herein, it is desired that the areas of parts of the light-receiving face of each of imaging elements occupied by the electric charge accumulation section and electric charge correction section are not more than one-tenth of the area of a part thereof occupied by the photosensitive section, respectively, because a more brilliant image can be formed by increasing the number of pixels.

Further, it is desired that the plurality of imaging elements are disposed in arrays; groups are each formed by mutually adjacent two imaging elements; the electric charge correction section is disposed between the two photosensitive sections included in the group; and one electric charge correction section is shared by the mutually adjacent two imaging elements. Thus, the number of the electric charge correction sections can be reduced.

Further, the invention provides an imaging apparatus which includes an image taking section for taking an image of an object by receiving light from the object by the plurality of imaging elements, and an optical system for focusing an image of the object on the image-taking section, and which receives light from the object through the optical system by the plurality of imaging elements and outputs electric charge thus accumulated, wherein the plurality of imaging elements each comprise: a photosensitive section which performs photoelectric conversion of incident light; an electric charge accumulation section which accepts transfer of electric charge accumulated by the photosensitive section owing to the incident light and which temporarily accumulates the electric charge; an electric charge correction section which estimates the amount of electric charge intruding into the electric charge accumulation section; operation means which corrects a first amount of electric charge accumulated in the electric charge accumulation section, which accepts transfer of electric charge accumulated in the photosensitive section in each of imaging elements, with a second amount of electric charge intruding into the electric charge correction section; and output means which regards a third amount of electric charge calculated by the operation means as the amount of electric charge of each of imaging elements to sequentially output the amounts of electric charge of the plurality of imaging elements.

Herein, as to the above arrangement, it is desired that procedures of accumulating and outputting electric charge in connection with the imaging apparatus of the invention include receiving the light from an object by the plurality of imaging elements, and parallel accumulates electric charge at the same time, and then sequentially outputting the amounts of electric charge of the plurality of imaging elements.

Further, according to the imaging apparatus of the invention, since the imaging apparatus involves the method of correcting sensitivity, it is possible to perform shading correction with good accuracy even with a simple structure; to sore an image of good accuracy with no image nonuniformity; and to gain an image of a good accuracy without image nonuniformity when the stored image is reproduced.

Now, it is desired that the image-taking section is a complementary metal oxide semiconductor (CMOS) sensor.

Now, in the case where the image-taking section is a complementary metal oxide semiconductor (CMOS) sensor, signals can be controlled easily even with a simple structure.

Further, it is desired that the plurality of imaging elements are disposed in arrays; in the case where groups are each formed by mutually adjacent two imaging elements, in each of groups one electric charge correction section is disposed between two photosensitive sections included in the group; and the operation means corrects a first amount of electric charge accumulated in the electric charge accumulation sections in the group including the electric charge correction section with a second amount of electric charge accumulated in the electric charge correction section. Thus, the electric charge correction sections can be reduced in number, and an imaging apparatus can be made more compact.

BRIEF DESCRIPTION OF DRAWINGS

Other and further objects, features, and advantages of the invention will be more explicit from the following detailed description taken with reference to the drawings wherein:

FIG. 5 is a schematic configuration view showing a schematic configuration of a scanner, which is intended to be connected to a projector, according to a second embodiment of the imaging apparatus to which the method of correcting sensitivity of the invention is applied;

FIG. 6A is a diagram schematically showing a layout of the photosensitive sections 15, electric charge accumulation sections 18 and electric charge correction sections 20 in connection with the aforementioned embodiment;

FIG. 6B is a diagram schematically showing a layout of the photosensitive sections 15, electric charge accumulation sections 18 and electric charge correction sections 20 in connection with this embodiment;

FIG. 7 is a diagram for explaining a takeout action by a camera module according to an embodiment;

FIG. 8 is a diagram for explaining a takeout action by a camera module according to an embodiment;

BEST MODE FOR CARRYING OUT THE INVENTION

Figure 1:
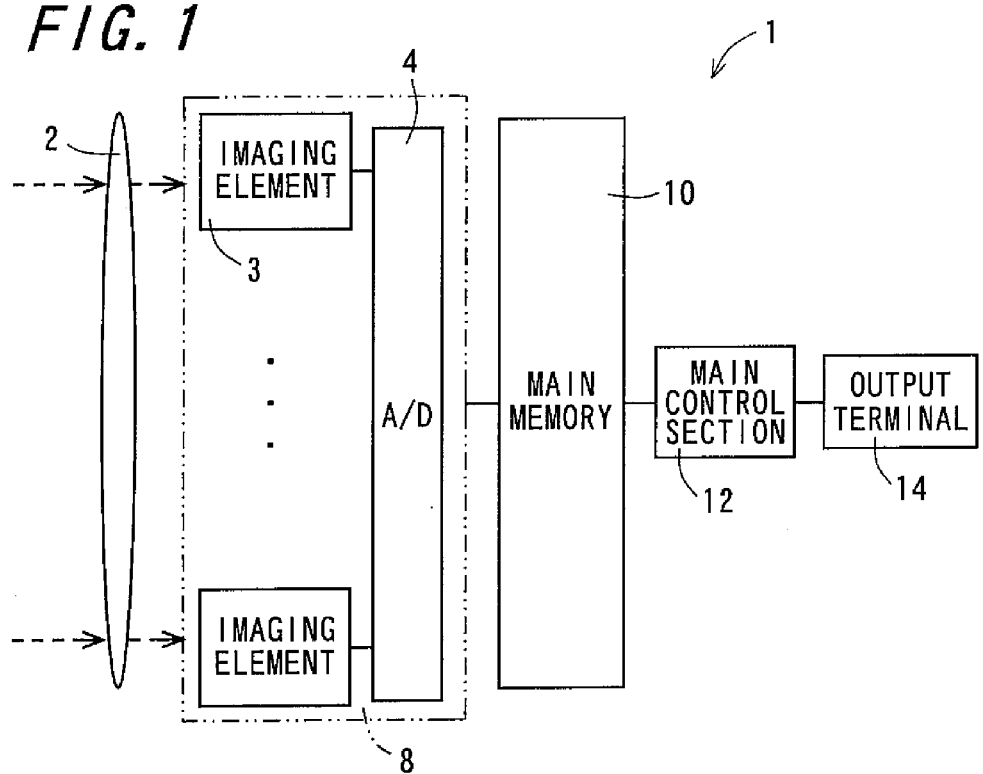
FIG. 1 is a schematic configuration view showing a schematic configuration of an on-vehicle camera module according to a first embodiment of an imaging apparatus to which the method of correcting sensitivity of the invention is applied.

Now referring to the drawings, preferred embodiments of the invention are described below.

FIG. 1 shows a schematic configuration of an on-vehicle camera module according to a first embodiment of an imaging apparatus to which the method of correcting sensitivity of the invention is applied.

Referring to FIG. 1, the camera module 1 according to the embodiment has an optical unit 2 including a lens for focusing light from an object, a plurality of imaging elements 3 laid out behind the optical unit 2 on an optical axis thereof, an A/D converter 4 housed in each of the plurality of imaging elements 3 and operable to convert an analog signal outputted from the imaging element 3 into a digital signal, a main memory 10, a main control section 12, and an output terminal 14. The camera module 1 of FIG. 1 has the plurality of imaging elements 3 and A/D converter 4 for converting analog captured data outputted from the plurality of imaging elements 3 into digital captured data inside a CMOS sensor 8.

According to the camera module 1 of FIG. 1, the digital captured data resulting from the conversion by the A/D converter 4 are stored in the main memory 10, undergo data processings such as gamma correction and white balance correction by the main control section 12 as required, and thereafter outputted as image data to the output terminal 14. Then, the image data are sent through the output terminal 14 to a display section (not shown) attached inside a vehicle to display a captured image, whereby the image is displayed.

Figure 2:
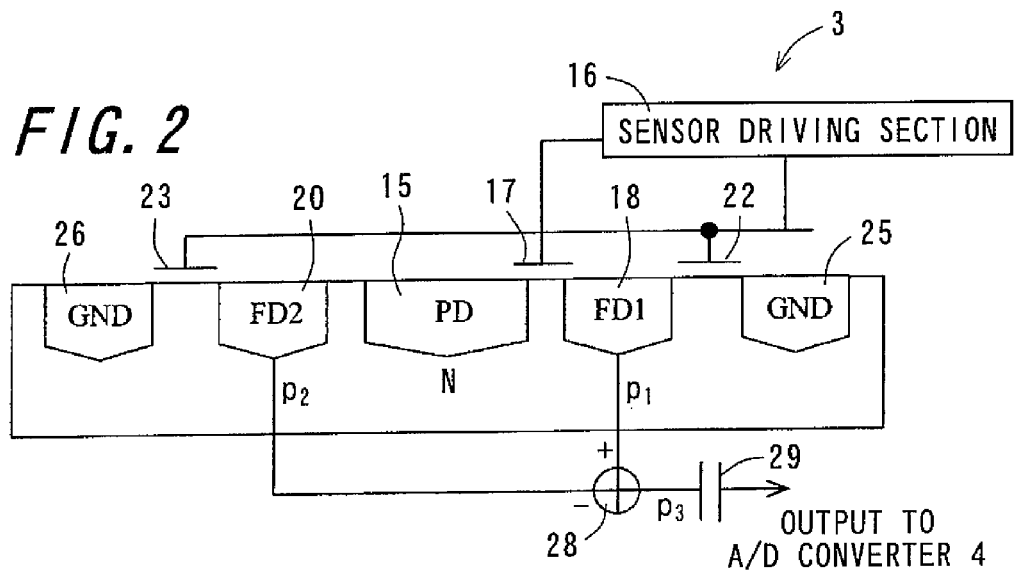
FIG. 2 is a conceptual diagram showing a schematic configuration of the imaging element 3.

FIG. 2 shows a schematic configuration of the imaging element 3. According to the invention, each of imaging elements 3 includes: a photosensitive section 15 which performs photoelectric conversion of incident light; an electric charge accumulation section 18 which accepts transfer of electric charge accumulated in photosensitive section 15 owing to the incident light with a shutter 17 or the like under the control of a sensor driving section 16, and which accumulates the electric charge; and an electric charge correction section 20 which estimates the amount of electric charge intruding into the electric charge accumulation section 18, as shown in FIG. 2. In the drawings, the photosensitive section 15 is denoted by "PD". The imaging elements 3 are arranged so that the electric charge accumulation section 18 and electric charge correction section 20 are connected by resets 22 and 23 to grounds 25 and 26 respectively when no electric charge is accumulated in the electric charge accumulation section 18 and electric charge correction section 20. Also, the imaging elements 3 is arranged so that electric charges accumulated in the electric charge accumulation section 18 and electric charge correction section 20 are outputted to operation means 28, and then a third amount of electric charge is calculated from a first amount of electric charge $p_1$ accumulated in the electric charge accumulation section 18 and a second amount of electric charge $p_2$ accumulated in the electric charge correction section 20, and outputted through the column switch 29 to the A/D converter 4.

Figure 3:
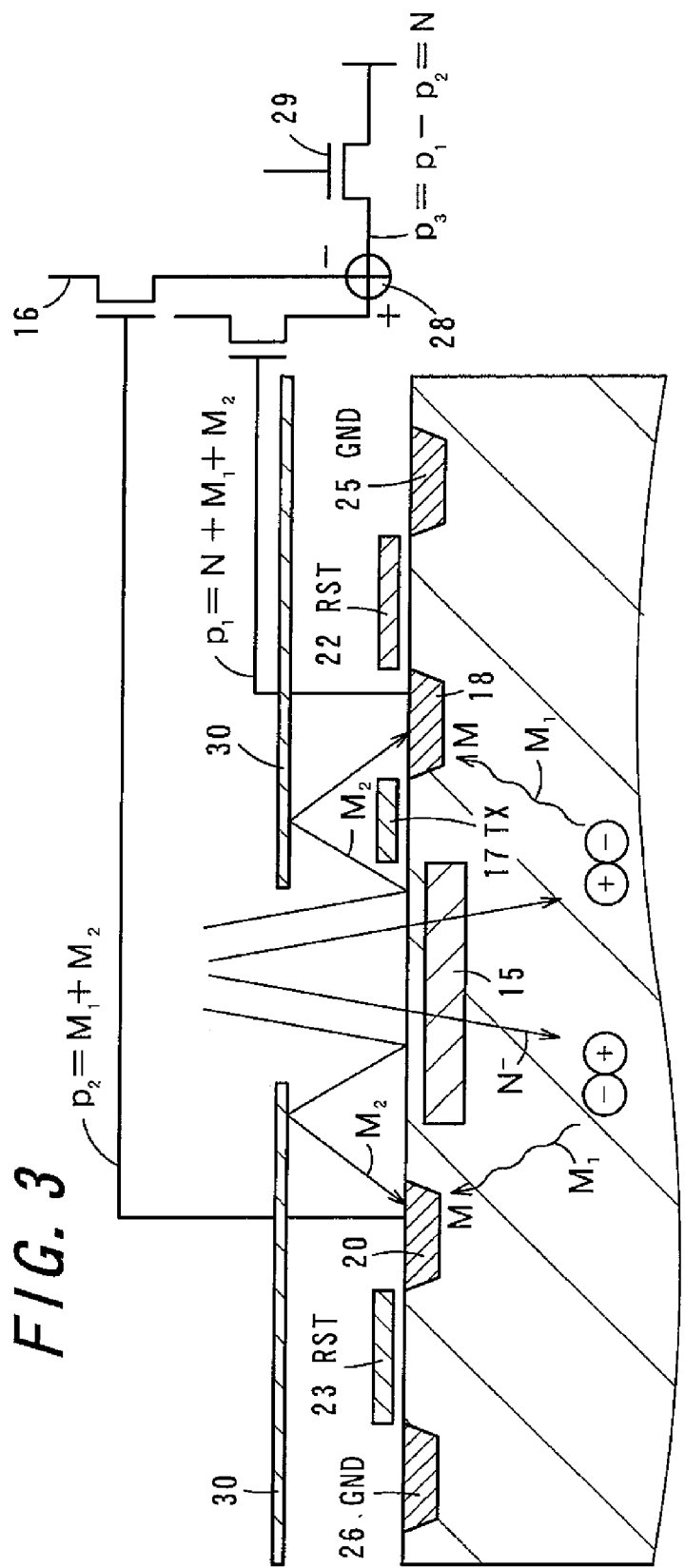
FIG. 3 is a schematic diagram showing a detailed configuration of the imaging element 3 of FIG. 2.

Now, FIG. 3 illustrates a schematic diagram showing a detailed configuration of the imaging element 3 of FIG. 2. Herein, the first amount of electric charge $p_1$ accumulated in the electric charge accumulation section 18 includes not only a amount of electric charge N transferred from the photosensitive section 15 but also the amount of intruding electric charge (denoted by M in the drawing) produced by causes including the occurrence of diffusion of electric charge caused in a portion below the photosensitive section 15 (denoted by $M_1$ in FIG. 3, and changed with time according to the intensity of received light), and intrusion of light reflected by the light-shielding aluminum plate 30 (denoted by $M_2$ in FIG. 3, and changed according to the intensity of received light). Therefore, as to an imaging apparatus such that all of the imaging elements 3 corresponding to one screen are exposed to light at the same time, and the amounts of electric charge accumulated as a result of the exposure of the imaging elements 3 are sequentially taken out after termination of the exposure, when a first amount of electric charge $p_1$ accumulated in each of electric charge accumulation sections 18 is outputted as a received light signal as it is, the received light signals from an object, which the imaging elements 3 have accepted originally, vary in amount of accumulated electric charge with no regularity, resulting in the development of image nonuniformity.

However, according to the method of correcting sensitivity of the invention, the electric charge correction section 20 estimates the amount of intruding electric charge produced by the causes of the diffusion of electric charge arising from a portion below the photosensitive section 15 of the photodiode as shown in FIG. 3 (denoted by $M_1$ in FIG. 3) or other component, and the reflection from the light-shielding aluminum plate 30 (denoted by $M_2$ in FIG. 3), and the operation means 28 calculates and outputs the third amount of electric charge $p_3$, which is a result of correcting the first amount of electric charge $p_1$ accumulated in the electric charge accumulation section 18 with the second amount of electric charge $p_2$ accumulated in the electric charge correction section 20, whereby the amount of temporal fluctuation of the amount of electric charge and the amount of fluctuation of the imaging element 3 depending on the intensity of received light can be corrected for each imaging element 3. Therefore, the fluctuation of the amount of electric charge of each of the imaging element 3 owing to the intruding electric charge can be adjusted in quantity to an accumulated electric charge in proportion to the amount of received light accepted by the imaging element regardless of the order of takeout from the imaging elements 3.

As the variations in amount of electric charge intruding into the electric charge accumulation section 18 can be corrected accurately, the shading which is caused particularly when receiving an image of the object in light and accumulating electric charge in the imaging elements at the same time, namely when capturing an image according to a method by which the elements start and terminate accumulation of electric charge with the same timing like the global shutter technique can be corrected with good accuracy even with a simple structure.

The second amount of electric charge $p_2$ is not necessarily equal to the amount of electric charge intruding into the electric charge accumulation section 18. The second amount of electric charge $p_2$ may be different from the amount of electric charge intruding into the electric charge accumulation section 18. In this case, the operation means 28 can make correction by increasing or decreasing the second amount of electric charge $p_2$ to be equal to the amount of electric charge intruding into the electric charge accumulation section 18 and subtracting the second amount of electric charge from the first amount of electric charge $p_1$. However, as the electric charge accumulation section 18 and electric charge correction section 20 are constructed of identical members disposed at locations separated from the photosensitive section 15 by the same distance, adjustment of layout of the members can be performed easily. In addition, the operation by the operation means 28 can be built by just a simple subtraction. Therefore, the memory of the operation means 28 may be small. Incidentally, the operation means 28 of each of the imaging elements 3 may be arranged to perform other shading corrections such as the gamma correction and white balance correction. Further, in the case that the rates of increase in the amount of intruding electric charge with respect to wavelengths are calculated in advance taking advantage of the property that the longer the wavelength is, the more electric charge intrudes, color shading correction can be performed by comparing the first amount of electric charge $p_1$ with the second amount of electric charge $p_2$.

In addition, it is desired that the electric charge accumulation section 18 and electric charge correction section 20 are floating diffusion amplifiers (FD1, FD2), as shown in FIG. 2. This makes it possible to open and close a shutter, and facilitates adjusting the timing of accumulating electric charge. Further, in contrast with e.g. the photosensitive section 15 which is a member occupying a large area of a part of the light-receiving face of the imaging element 3 like a photodiode, a floating diffusion amplifier occupies a smaller area of a part thereof. Therefore, the area of the part of the light-receiving face of the imaging elements 3 can be reduced, and the number of pixels corresponding to the number of imaging elements of the CMOS sensor 8 can be increased. As a result, a more brilliant image can be formed.

In this regard, it is desired that the areas of parts of the light-receiving face of the imaging element 3 occupied by the electric charge accumulation sections 18 and electric charge correction section 20 are not more than one-tenth of the area of a part thereof occupied by the photosensitive section 15, respectively, because a more brilliant image can be formed by increasing the number of pixels.

Further, a COD element (CCD: Charge Coupled Device) may be used as the imaging element 3. In case of using a CMOS sensor 8, the electric charge accumulation section 18 and electric charge correction section 20 can be formed in the CMOS sensor 8 according to a simple structure, and signal control can be performed easily. Therefore, the method of correcting sensitivity is particularly useful.

Figure 4:
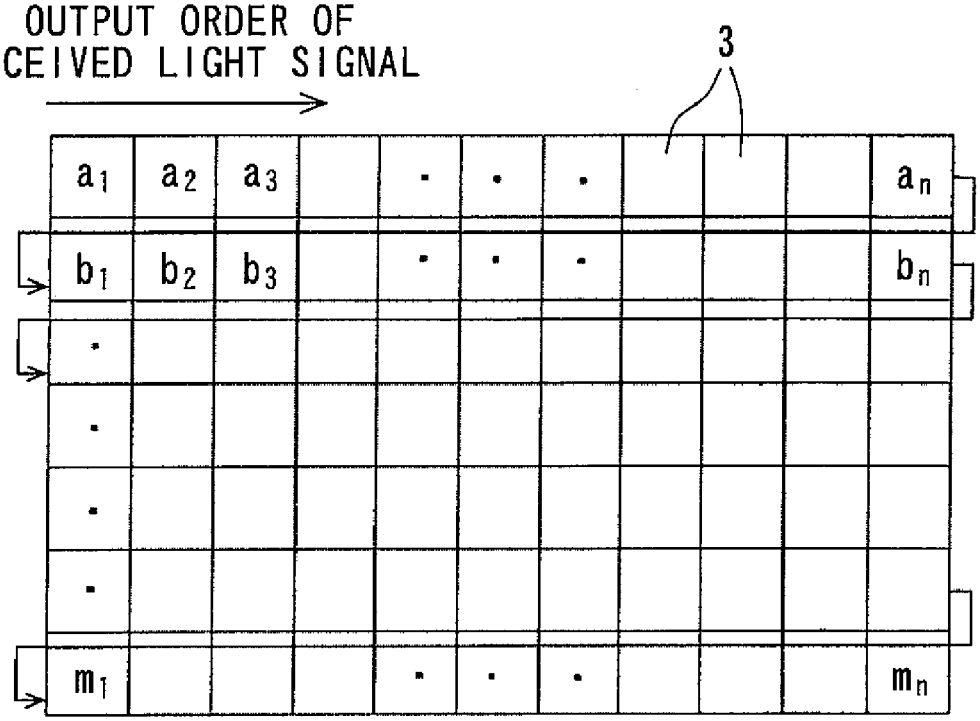
FIG. 4 is a schematic diagram showing an example of the order of outputting received light signals from the respective imaging elements.
Figure 9:
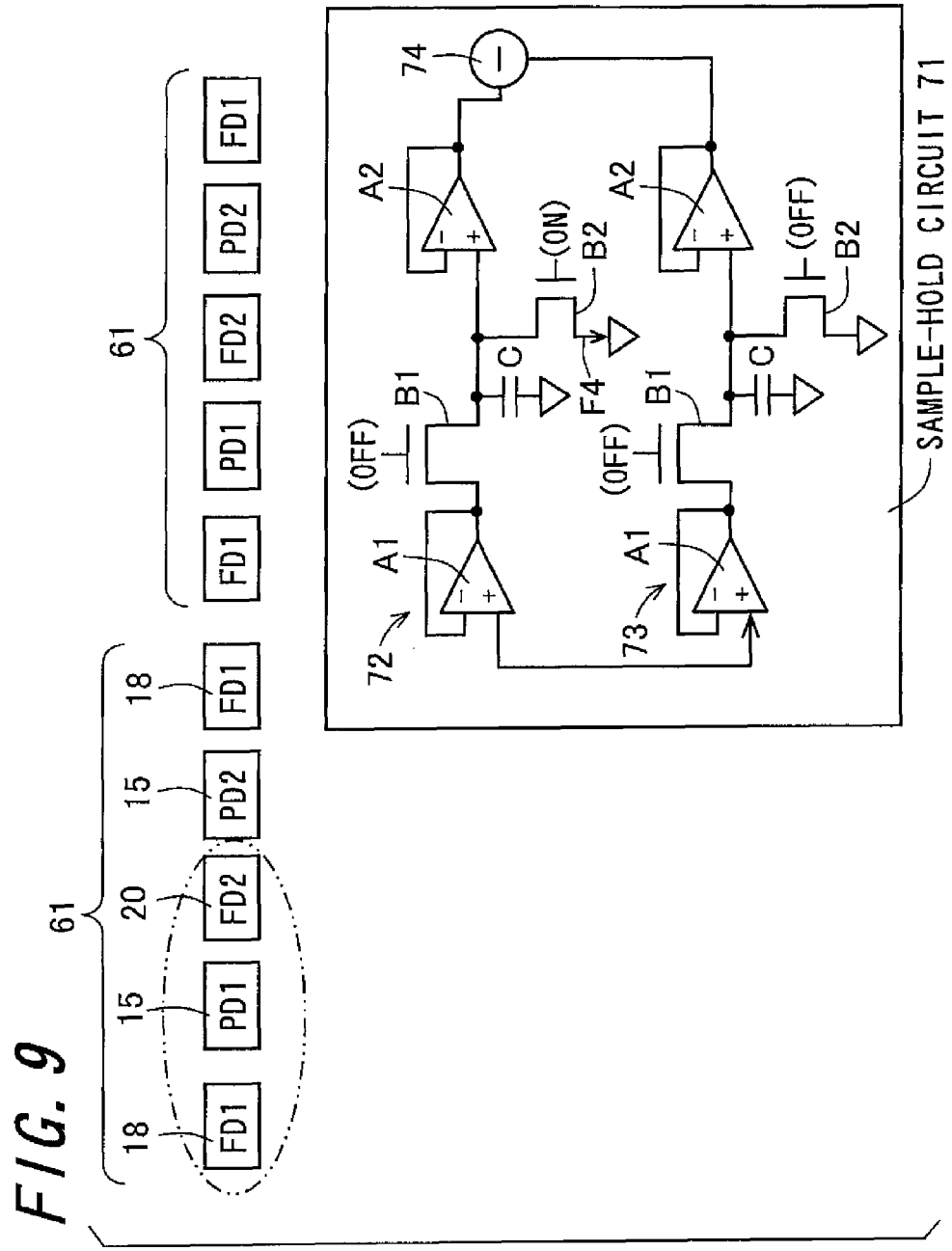
FIG. 9 is a diagram for explaining a takeout action by a camera module according to an embodiment.
Figure 10:
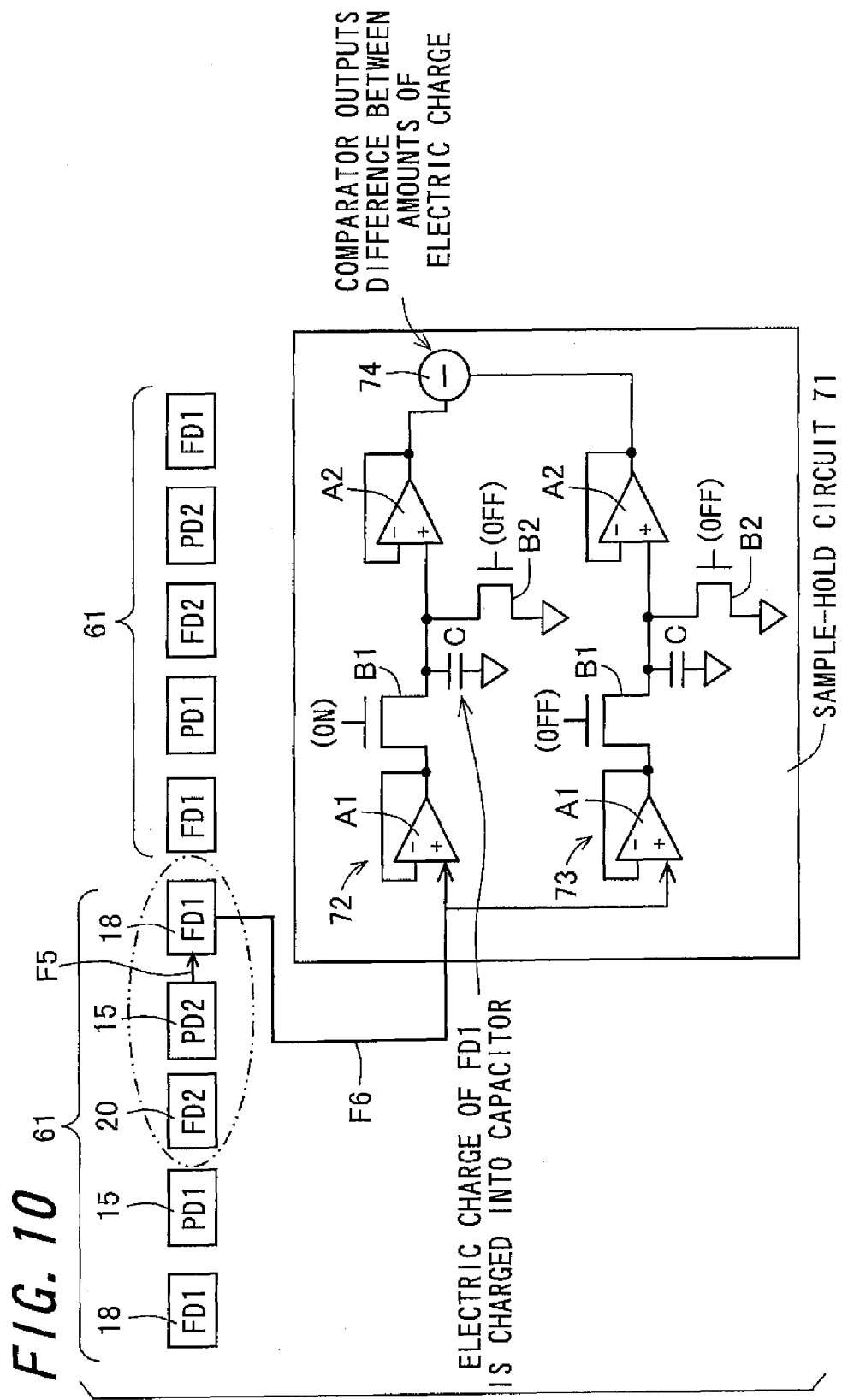
FIG. 10 is a diagram for explaining a takeout action by a camera module according to an embodiment.

Here, the data processing method according to this embodiment will be described more specifically. First, FIG. 4 shows an example of the order of outputting received light signals from the respective imaging elements. As shown in the schematic diagram, the imaging elements 3 are arrayed in m rows×n columns. All of the imaging elements 3 corresponding to one screen start and terminate electric charge accumulation at the same time, and concurrently with the termination, transfer the accumulated electric charges to the respective electric charge accumulation sections 18. Then, with e.g. the pattern of m rows×n columns of the imaging elements 3 shown in FIG. 4, captured data of the imaging elements 3 ($a_1, a_2, \ldots m_n$) on amounts of electric charge $p_1$ accumulated in the electric charge accumulation sections 18 are outputted through the respective column switches 29 in the order of $a_1, a_2, a_3, \ldots a_n, b_1, b_2, b_3, \ldots m-1_1, m-1_2 \ldots m-1_n, m_1, m_2, m_3 \ldots m_n$.

At this time, according to the invention, the first amount of electric charge $p_1$ accumulated in the electric charge accumulation section 18 is corrected by the operation means 28 with the second amount of electric charge $p_2$ accumulated in the electric charge correction section 20. The third amount of electric charge $p_3$ resulting from the correction makes a signal which the imaging element 3 has sensed. The signals sensed by the imaging elements 3 are sequentially outputted through the respective column switches 29 as analog signals, and converted into digital signals by the A/D converter 4 and concurrently stored in the main memory 10 used as storing means. Now, it is noted that the order in which the captured data of the imaging elements 3 are taken out is not limited to the order described above. The captured data may be taken out along a column, direction, and other order is possible.

The method of correcting sensitivity of the invention is also applicable to a rolling shutter method that imaging elements accumulate electric charge sequentially and then output the electric charge in sequence.

The imaging apparatus of the invention is not limited to the camera module as described above. Also, it can be preferably applied to e.g. a scanner to be connected to a projector.

Here, FIG. 5 shows a schematic configuration of a scanner, which is intended to be connected to a projector, according to a second embodiment of the imaging apparatus to which the method of correcting sensitivity of the invention is applied.

Referring to FIG. 5, the scanner 41 of this embodiment includes: a document table 42 which is made of a transparent glass plate and on which the document is placed; a document cover 43 provided to be able to opened and closed pivotally for covering an upper surface of the document table 42; an illumination lamp 44 for illuminating a document placed and kept stationary on the document table 42; a lens unit 47 having lenses 46; imaging elements 45 which receive light reflected by a document resulting from illumination of the document by the illumination lamp 44; an A/D converter 49 which converts analog signals outputted by the imaging elements 45 into digital signals; a main memory 50 used as storing means for saving digital captured data resulting from the conversion by the A/D converter 49; a main control section 51 used as operation means for holding the order of capturing digital captured data of the main memory 50, a program for data processing, a parameter, etc.; and an output terminal 52 for outputting a captured image stored by the imaging elements 45 to an external apparatus such as a projector (not shown).

The document placed and kept stationary on the document table 42 is lit by the illumination lamp 44. The light reflected by the document travels through optical members, and is guided by the lens unit 47 including the lenses 46 and composed of a focusing optical system (the number of lenses 46 is two in FIG. 4). The lens unit 47 focuses the light reflected by the document on the imaging elements 45. Further, the lens unit 47 is arranged so that it can be moved along an optical axis of entering light and focus on the imaging elements 45 at a desired magnification. Thus, an image recorded on a document placed on the document table 42 is captured by the imaging elements 45. The captured data are produced resulting from the capture by the imaging elements 45, and outputted to an external apparatus (not shown) such as a projector through the output terminal 52.

Also, in this embodiment, all of the imaging elements 45 corresponding to one screen are made to start sensing light from a document at the same time and to terminate the sensing concurrently. The imaging elements 45 each have: a photosensitive section which performs photoelectric conversion of incident light; an electric charge accumulation section which accepts transfer of electric charge accumulated in the photosensitive section, and temporarily accumulates the electric charge; and an electric charge correction section which estimates the amount of electric charge intruding into the electric charge accumulation section. The first amount of electric charge $p_1$ accumulated in the electric charge accumulation section is corrected with the second amount of electric charge $p_2$ accumulated in the electric charge correction section to calculate and output the third amount of electric charge $p_3$, whereby the amounts of temporal fluctuations in electric charge are corrected. The shading, which is brought about when an image of an object is captured by the imaging elements 45 accumulating at the same time, can be corrected with good accuracy even with a simple structured.

In the aforementioned embodiment, each of the imaging elements has one photosensitive section, and one electric charge accumulation section and one electric charge correction section laid out on two opposite sides of the photosensitive section. Therefore, if there are two pairs of photosensitive sections, two electric charge accumulation sections and two electric charge correction sections are required. However, according to another embodiment of the invention, adjacent elements of the imaging elements as described concerning the aforementioned embodiment may share section of their components, e.g. one load electric charge correction section. FIG. 6A schematically shows a layout of the photosensitive sections 15, electric charge accumulation sections 18 and electric charge correction sections 20 in connection with the aforementioned embodiment. FIG. 6B schematically shows a layout of the photosensitive sections 15, electric charge accumulation sections 18 and electric charge correction sections 20 in connection with this embodiment. In FIGS. 6A and 6B, the ground is omitted to prevent the drawings from being more complicated. However, the grounds 25 and 26 are provided corresponding to the electric charge accumulation section 18 and electric charge correction section 20 respectively. Parts similar to those in the configuration of the aforementioned embodiment are identified by the same reference numerals or characters, and their detailed descriptions are omitted here.

Further, in FIG. 6A, the fewest essential components, i.e. the photosensitive sections 15, electric charge accumulation sections 18 and electric charge correction sections 20, which are necessary to form a layout unit including two photosensitive sections 15, are arranged into one group 60. In FIG. 6B, the fewest essential components, i.e. the photosensitive sections 15, electric charge accumulation sections 18 and electric charge correction section 20, which are necessary to form a layout unit including two photosensitive sections 15, are arranged into one group 61. In FIGS. 6A and 6B, the photosensitive sections 15 included in each of the groups 60 and 61 are denoted by PD1 and PD2.

In this embodiment, the imaging elements are disposed in columns. The electric charge correction section 20 is in electric charge of the neighboring photosensitive sections 15 and shared by the imaging elements 3 which include the two photosensitive sections 15 respectively. In the aforementioned embodiment, in respective groups 60, the electric charge accumulation sections 18, photosensitive sections 15, electric charge correction sections 20 are arrayed in the order as illustrated like the electric charge accumulation section 18, photosensitive section 15, electric charge correction section 20, electric charge accumulation section 18, photosensitive section 15 and electric charge correction section 20. However, in this embodiment, as to each of the groups 61, only one electric charge correction section 18 is disposed between the two photosensitive sections 15 included in the group 61. In other words, the electric charge accumulation sections 18, photosensitive sections 15 and electric charge correction section 20 are arrayed in the order as illustrated like the electric charge accumulation section 18, photosensitive section 15, electric charge correction section 20, photosensitive section 15 and electric charge accumulation section 18. Thus, the total number of the electric charge accumulation sections 18 and electric charge correction sections 20 per unit group can be made three-fourth.

FIGS. 7 to 10 are diagrams for explaining a takeout action by a camera module according to an embodiment. The camera module of the embodiment includes a sample-hold circuit 71 as the operation means 28 as described above. The sample-hold circuit 71 includes: first and second portions 72 and 73 which can accumulate electric charge respectively, and a comparator 74 which determines and outputs the difference between amounts of electric charge accumulated in the first and second portions 72 and 73.

The first and second portions 72 and 73 are the same in structure. Therefore, only the first portion 72 will be described. As to the second portion 73, the constituents the same as those of the first portion 72 are identified by the same reference numerals or characters, and their descriptions are omitted. The first portion 72 includes two buffer amplifiers A1 and A2, two switches B1 and B2, and a capacitor C. A non-inverting input of the buffer amplifier A1 is connected to an input of the sample-hold circuit, and an inverting input of the buffer amplifier A1 is connected to an output of the buffer amplifier A1. An output of the buffer amplifier A1 is connected to one end of the capacitor C through the switch B1. Also, the one end of the capacitor C is connected to the ground through the switch B2. The switches B1 and B2 are on-off switches, which are realized by field effect transistors. When a voltage of its threshold or larger is applied to the gate, the switch B1 is turned on, and electrically connects between the output of the buffer amplifier A1 and the one end of the capacitor C. When the voltage applied to the gate is below the threshold, the switch B1 disconnects between the output of the buffer amplifier A1 and the one end of the capacitor C electrically. The other end of the capacitor C is kept connected to the ground. When a voltage of its threshold or larger is applied to the gate, the switch B2 is turned on, and electrically connects between the one end of the capacitor C and the ground. When the voltage applied to the gate is below the threshold, the switch B2 disconnects between the one end of the capacitor C and the ground electrically. The other end of the capacitor C is connected to a non-inverting input of the buffer amplifier A2, and an inverting input of the buffer amplifier A2 is connected to an output of the buffer amplifier A2. The output of the buffer amplifier A2 is connected to an input of the comparator 74. An output of the comparator 74 is connected to a row switch 29.

In this embodiment, each of photosensitive sections 15 is made to receive light, and accumulate electric charge, first. Here, actions on the group 61 ranked first when numbering form one end in an array direction in which the photosensitive section 15, electric charge accumulation section 18 and electric charge correction section 20 are arrayed, will be described. However, the same shall be said for the other groups 61. Here, the switches B1 and B2 of the first and second portions 71 and 72 stay in OFF states. The electric charge accumulation section 18 and electric charge correction section 20 are connected to the input of the sample-hold circuit 71 electrically. Based on the three sections, i.e. the electric charge accumulation section 18 (FD1), photosensitive section 15 (PD1) and electric charge correction section 20 (FD2) arrayed at first to third locations in order from the one end in the array direction in which the photosensitive section 15, electric charge accumulation section 18 and electric charge correction section 20 are arrayed, the first amount of electric charge $p_1$ acquired by the photosensitive section 15 (PD1) is corrected. First amount of electric charge accumulated in the electric charge accumulation section 18 (FD1), photosensitive section 15 (PD1) and electric charge correction section 20 (FD2) arrayed at the first to third locations in order from the one end of the array direction are moved. Here, the electric charge of the photosensitive section 15 (PD1) is moved to the electric charge accumulation section 18 (FD1) disposed on the side of the one end of the array direction with respect to the photosensitive section 15 (PD1) by the switch 17 as indicated by the arrow F1 of FIG. 7. In addition, a voltage of the threshold or larger is applied to the gate of the switch B1 of the second portion 73, thereby turning the switch on. Thus, the switch B1 of the second portion 73 is brought into conduction. Then, the electric charge is moved as indicated by the arrow F2 of FIG. 7, and thus the electric charge of the electric charge correction section 20 (FD2) is charged into the capacitor C of the second portion 73.

Next, the switch 17 and the switch B1 of the second portion 73 are turned off, and a voltage of the threshold or larger is applied to the gate of the switch B1 of the first portion 72 to turn on the switch. Thus, the switch B1 of the first portion 72 is brought into conduction, and the electric charge is moved as indicated by the arrow F3 of FIG. 8, whereby the electric charge of the electric charge accumulation section 18 (FD1) is charged into the capacitor C of the first portion 72. According to the actions as described so far, electric charge is accumulated in the capacitor C of the first and second portions 72 and 73. Then, the comparator 74 produces a third amount of electric charge $p_3$ consisting of the difference between the first amount of electric charge $p_1$ accumulated in the capacitor C of the first portion 72 and the second amount of electric charge $p_2$ accumulated in the capacitor C of the second portion 73. The third amount of electric charge $p_3$ is outputted from the sample-hold circuit 71.

Subsequently, the switch B1 of the first portion 72 is turned off to perform actions to reset the three sections, i.e. the electric charge accumulation section 18, photosensitive section 15 and electric charge correction section 20 in order from the one end of the array direction. Specifically, in order from the one end of the array direction, the switches 17, 25 and 26 corresponding to the three sections, i.e. the electric charge accumulation section 18, photosensitive section 15 and electric charge correction section 20 are turned on to electrically connect the sections to the ground. Further, a voltage of the threshold or larger is applied to the gate of the switch B2 of the first portion 72 to turn on the switch. Thus, the switch B2 of the first portion 72 is brought into conduction. Then, as indicated by the arrow F4 of FIG. 9, the electric charge accumulated in the capacitor C is moved to the ground, whereby the electric charge accumulated in the capacitor C becomes zero.

Next, the first amount of electric charge $p_1$ acquired by the photosensitive section 15 (PD2) is connected based on the three sections, i.e. the electric charge correction section 20 (FD2), photosensitive section 15 (PD2) and electric charge accumulation section 18 (FD1) arrayed at the third to fifth locations in order from the one end of the array direction. In this step, electric charge accumulated in the photosensitive section 15 (PD2) is moved to the electric charge accumulation section 18 (FD1) disposed on the side of the other end of the array direction with respect to the photosensitive section 15 (PD2) by the switch 17 as indicated by the arrow F5 of FIG. 10, and the switch B1 of the first portion 72 is turned on. Thus, the switch B1 of the first portion 73 is brought into conduction. Then, electric charge is moved as indicated by the arrow F6 of FIG. 10, and thus the electric charge of the electric charge accumulation section 18 (FD1) is charged into the capacitor C of the first portion 72. In the capacitor C of the second portion 73, electric charge has been already accumulated. By the actions as described so far, electric charge is accumulated in the capacitor C of each of the first and second portions 72 and 73. Then, the comparator 74 produces a third amount of electric charge $p_3$ consisting of the difference between the first amount of electric charge $p_1$ accumulated in the capacitor C of the first portion 72 and the second amount of electric charge $p_2$ accumulated in the capacitor C of the second portion 73. The third amount of electric charge $p_3$ is outputted from the sample-hold circuit 71.

After the actions as described above have been performed on the group 61 ranked first when numbering form the one end in the array direction, the same actions are performed on the group 61 ranked second when numbering from the one end of the array direction. In this way, the same actions are sequentially repeated from the one end to the other in the array direction by the number of times as many as the number of the groups 61.

According to the actions as described above, the first amount of electric charge $p_1$ coming from two photosensitive sections 15 included in one group 61 can be each corrected with the second amount of electric charge $p_2$, to output the third amount of electric charge $p_3$ resulting from the correction respectively even when the groups are arranges to include a smaller number of electric charge correction sections 20 in comparison to the aforementioned embodiment. Hence, in comparison to the embodiments described above, imaging elements 3 can be made smaller in size and therefore, further downsizing of an imaging apparatus can be achieved.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

The invention claimed is:

1. A method of correcting sensitivity for removing shading arising at a time of capturing an image of an object by receiving light from the object by a plurality of imaging elements, the imaging elements each comprising a photosensitive section which receives incident light to perform photoelectric conversion, an electric charge accumulation section which accepts transfer of electric charge accumulated in the photosensitive section owing to the incident light and which temporarily accumulates the electric charge, and an electric charge correction section which estimates electric charge intruding into the electric charge accumulation section, the method comprising receiving light from the object by the imaging elements to accumulate electric charge, thereafter transferring electric charge accumulated in the photosensitive section to the electric charge accumulation section, correcting a first amount of electric charge accumulated in the electric charge accumulation section with a second amount of electric charge having intruded into the electric charge correction section to produce a third amount of electric charge, and sequentially outputting third amounts of electric charge as amounts of electric charge of the respective imaging elements.

2. The method of correcting sensitivity of claim 1, wherein after the light from the object are received by the plurality of imaging elements and at the same time the electric charge is accumulated, and then the amounts of electric charge of the plurality of imaging elements are sequentially outputted.

3. The method of correcting sensitivity of claim 1, wherein the electric charge accumulation section and electric charge correction section are constructed of identical members disposed at locations separated from the photosensitive section by a same distance.

4. The method of correcting sensitivity of any one of claim 1, wherein the electric charge accumulation section and electric charge correction section are floating diffusion amplifiers.

5. The method of correcting sensitivity of claim 1, wherein areas of parts of the light-receiving face of each of the imaging elements occupied by the electric charge accumulation section and electric charge correction section are not more than one-tenth of an area of a part thereof occupied by the photosensitive section, respectively.

6. The method of correcting sensitivity of claim 1, wherein the plurality of imaging elements are disposed in arrays, groups are each formed by mutually adjacent two imaging elements, the electric charge correction section is disposed between the two photosensitive sections included in the group, and one electric charge correction section is shared by the mutually adjacent two imaging elements.

7. An imaging apparatus comprising:
a plurality of imaging elements for receiving light from an object; and
an optical system for focusing an image of the object on the imaging elements,
the imaging apparatus receiving light from the object through the optical system by the plurality of imaging elements and outputting electric charge thus accumulated,
the plurality of imaging elements each comprising:
a photosensitive section which performs photoelectric conversion of incident light;
an electric charge accumulation section which accepts transfer of electric charge accumulated by the photosensitive section owing to the incident light and which temporarily accumulates the electric charge;
an electric charge correction section which estimates the amount of electric charge intruding into the electric charge accumulation section;
operation means which corrects a first amount of electric charge accumulated in the electric charge accumulation section, which accepts transfer of electric charge accumulated in the photosensitive section in each of imaging elements, with a second amount of electric charge intruding into the electric charge correction section; and
output means which regards a third amount of electric charge calculated by the operation means as an amount of electric charge of each of imaging elements to sequentially output the amounts of electric charge of the plurality of imaging elements.

8. The imaging apparatus of claim 7, wherein the light from an object is received by the plurality of imaging elements, and at the same time electric charge is accumulated, and then the amounts of electric charge of the plurality of imaging elements are sequentially outputted.

9. The imaging apparatus of claim 7, wherein the plurality of imaging elements are disposed in arrays; in the case where groups are each formed by mutually adjacent two imaging elements, in each of groups one electric charge correction section is disposed between two photosensitive sections included in the group, and
the operation means corrects a first amount of electric charge accumulated in the electric charge accumulation sections in the group including the electric charge correction section with a second amount of electric charge accumulated in the electric charge correction section.

* * * * *